(12) United States Patent
Ariyuki

(10) Patent No.: US 10,753,011 B2
(45) Date of Patent: Aug. 25, 2020

(54) CLEANING METHOD AND LAMINATE OF ALUMINUM NITRIDE SINGLE-CRYSTAL SUBSTRATE

(71) Applicant: Tokuyama Corporation, Yamaguchi (JP)

(72) Inventor: Masao Ariyuki, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 21 days.

(21) Appl. No.: 15/508,501

(22) PCT Filed: Aug. 21, 2015

(86) PCT No.: PCT/JP2015/073552
§ 371 (c)(1),
(2) Date: Mar. 3, 2017

(87) PCT Pub. No.: WO2016/039116
PCT Pub. Date: Mar. 17, 2016

(65) Prior Publication Data
US 2017/0260650 A1    Sep. 14, 2017

(30) Foreign Application Priority Data
Sep. 11, 2014   (JP) .................. 2014-185567

(51) Int. Cl.
*C30B 25/18*    (2006.01)
*C23C 16/34*    (2006.01)
*H01L 21/02*    (2006.01)
*C11D 3/37*     (2006.01)
*C30B 29/68*    (2006.01)
*C30B 33/10*    (2006.01)
*C08J 7/06*     (2006.01)
*C11D 7/06*     (2006.01)
*C11D 7/08*     (2006.01)
*C11D 7/26*     (2006.01)
*C11D 11/00*    (2006.01)
*C23C 16/02*    (2006.01)
*C30B 29/40*    (2006.01)
*H01L 21/3105*  (2006.01)

(52) U.S. Cl.
CPC ............... *C30B 25/186* (2013.01); *C08J 7/06* (2013.01); *C11D 3/37* (2013.01); *C11D 7/06* (2013.01); *C11D 7/08* (2013.01); *C11D 7/265* (2013.01); *C11D 11/0047* (2013.01); *C23C 16/0227* (2013.01); *C23C 16/34* (2013.01); *C30B 25/18* (2013.01); *C30B 29/403* (2013.01); *C30B 29/68* (2013.01); *C30B 33/10* (2013.01); *H01L 21/0206* (2013.01); *H01L 21/02024* (2013.01); *H01L 21/02052* (2013.01); *H01L 21/0254* (2013.01); *H01L 21/0262* (2013.01); *H01L 21/02096* (2013.01); *H01L 21/02178* (2013.01); *H01L 21/02271* (2013.01); *H01L 21/02389* (2013.01); *H01L 21/02576* (2013.01); *H01L 21/02658* (2013.01); *H01L 21/31053* (2013.01); *C08J 2329/04* (2013.01); *C08J 2367/00* (2013.01); *C08J 2377/00* (2013.01); *C08J 2379/04* (2013.01)

(58) Field of Classification Search
CPC ............... C08J 2329/04; C08J 2367/00; C08J 2377/00; C08J 2379/04; C08J 7/06; C11D 11/0047; C11D 3/37; C11D 7/06; C11D 7/08; C11D 7/265; C23C 16/0227; C23C 16/34; C30B 25/18; C30B 25/186; C30B 29/38; C30B 29/403; C30B 33/10; H01L 21/02024; H01L 21/02052; H01L 21/0206; H01L 21/02096; H01L 21/02178; H01L 21/02271; H01L 21/02389; H01L 21/0254; H01L 21/02576; H01L 21/0262; H01L 21/02658; H01L 21/31053
See application file for complete search history.

(56) References Cited

U.S. PATENT DOCUMENTS

| | | | |
|---|---|---|---|
| 7,323,414 B2 | 1/2008 | Schowalter et al. | |
| 7,645,340 B2 | 1/2010 | Koukitu et al. | |
| 7,851,381 B2 | 12/2010 | Ishibashi et al. | |
| 8,475,599 B2 | 7/2013 | Freer et al. | |
| 9,343,525 B2 | 5/2016 | Hironaka et al. | |

(Continued)

FOREIGN PATENT DOCUMENTS

| | | |
|---|---|---|
| EP | 1863074 A2 | 5/2007 |
| JP | 2001-009386 A | 1/2001 |

(Continued)

OTHER PUBLICATIONS

Rice et al., Journal of Applied Physics 108, 043510, 2010 (Year: 2010).*

(Continued)

*Primary Examiner* — Hua Qi
(74) *Attorney, Agent, or Firm* — Cahn & Samuels, LLP

(57) ABSTRACT

A method for effectively removing minute impurities of 1 μm or less in size that are present on a surface of an aluminum nitride single-crystal substrate without etching the surface includes scrubbing a surface of an aluminum nitride single-crystal substrate using a polymer compound material having lower hardness than an aluminum nitride single crystal, and an alkali aqueous solution having 0.01-1 mass % concentration of potassium hydroxide or sodium hydroxide, the alkali aqueous solution being absorbed in the polymer compound material.

16 Claims, No Drawings

(56) References Cited

U.S. PATENT DOCUMENTS

| | | | |
|---|---|---|---|
| 9,748,410 B2 | 8/2017 | Kinoshita et al. | |
| 9,806,205 B2 | 10/2017 | Kinoshita et al. | |
| 2004/0033690 A1 | 2/2004 | Schowalter et al. | |
| 2005/0026802 A1* | 2/2005 | Kilkenny | C11D 3/044 |
| | | | 510/295 |
| 2007/0084483 A1 | 4/2007 | Freer et al. | |

FOREIGN PATENT DOCUMENTS

| | | | | |
|---|---|---|---|---|
| JP | 2001009386 A | * | 1/2001 | |
| JP | 2003303774 A | | 10/2003 | |
| JP | 2005-510072 A | | 4/2005 | |
| JP | 2006016249 A | | 1/2006 | |
| JP | 2006-060069 A | | 3/2006 | |
| JP | 2006060069 A | * | 3/2006 | |
| JP | 2006240895 A | | 3/2006 | |
| JP | 2009-522789 A | | 6/2009 | |
| JP | 2010-109329 A | | 5/2010 | |
| JP | 2010-180111 A | | 8/2010 | |
| JP | 2012-072267 A | | 4/2012 | |
| JP | 2012072267 A | * | 4/2012 | |

OTHER PUBLICATIONS

European Search report, PCT/JP2015/073552, dated Mar. 19, 2018.
Dalmau et al., "Growth and Characterization of AlN and AlGaN Epitaxial Films on AlN Single Crystal Substrates", Journal of the Electrochemical Society, 158 (5) H530-H535 (2011).
Notification of Transmittal of Translation of the International Preliminary Report on Patentability, PCT/JP2015/073552, dated Mar. 23, 2017.
English abstract of JP 2006-060069.
English abstract of JP 2010-109329.
English abstract of JP 2003303774.
English abstract of JP 2010-180111.
English abstract of JP 2012-072267.
English abstract of JP 2009-522789.
English abstract of JP 2005-510072.
English abstract of JP 2001-009386.
Zhuang et al., "Defect-selective etching of bulk AlN single crystals in molten KOH/NaOH eutectic alloy," Journal of Crystal Growth 262 (2004) 89-94.
English abstract of JP 2006240895A, Mar. 1, 2006.
English Abstract of JP 2006016249A, Jan. 19, 2006.

\* cited by examiner

CLEANING METHOD AND LAMINATE OF ALUMINUM NITRIDE SINGLE-CRYSTAL SUBSTRATE

This application is a U.S. national stage application of PCT/JP2015/073552 filed on 21 Aug. 2015 and claims priority to Japanese patent document 2014-185567 filed on 11 Sep. 2014, the entireties of which are incorporated herein by reference.

TECHNICAL FIELD

The present invention relates to a cleaning method of a aluminum nitride single crystal substrate, and a production method of a laminated body wherein an aluminum gallium nitride layer ($Al_xGa_{1-x}N$, $0 \leq x \leq 1$) is provided on the substrate obtained from the cleaning method, and also the present invention relates to the aluminum nitride single crystal substrate significantly reduced with the number of the foreign matters.

BACKGROUND OF THE INVENTION

A group III nitride semiconductor including an aluminum gallium nitride layer ($Al_xGa_{1-x}N$, $0 \leq x \leq 1$) has a band structure with direct band gap at ultra violet range corresponding to the wavelength of 200 nm to 360 nm, hence a highly efficient ultraviolet device can be produced. Such group III nitride semiconductor device is produced by carrying out the crystal growth of the group III nitride semiconductor thin film on the single crystal substrate by vapor phase deposition methods such as Metal Organic Chemical Vapor deposition (MOCVD) method, Molecular Beam Epitaxy (MBE) method, or Hydride Vapor Phase Epitaxy (HVPE) method or so. Among these, MOCVD method is most widely used industrially, because the thickness of the film can be controlled at atomic layer level, and also relatively high growth rate can be obtained.

Also, as the single crystal substrate allowing the crystal growth of the group III nitride semiconductor thin film, for example the aluminum nitride single crystal substrate obtained by known crystal growth methods such as HVPE method disclosed in the patent document 1 and a Physical Vapor Transport method are used. The aluminum nitride single crystal substrate obtained as such is usually processed into ultraflat surface by carrying out Chemical Mechanical Planarization or so which uses an abrasive such as colloidal silica or so against a surface of said substrate. As such, by making the substrates surface ultraflat, the aluminum gallium nitride layer ($Al_xGa_{1-x}N$, $0 \leq x \leq 1$) can be easily deposited on said substrate, and also those with high quality can be obtained.

Also, the patent document 2 discloses a cleaner composition for electronic device substrate which includes alkaline metal hydroxides and citric acid. According to the composition disclosed in this article, the abrasive and polishing debris remaining on the substrate surface can be efficiently removed when polishing the electronic device substrate. The electronic device substrate which is the subject of the cleaning in this article is the semiconductor substrate or so having an alkaline resistance, and it discloses that silicon, silicon carbide, zinc oxide and sapphire or so are preferable.

PRIOR ART

[Patent Article 1] JP Patent No. 3803788
[Patent Article 2] JP Patent Application Laid Open No. 2010-109329

DISCLOSURE OF INVENTION

Problem to be Solved by the Invention

However, when the present inventors verified the condition of the aluminum nitride single crystal substrate surface after the polishing by CMP method, foreign matters difficult to remove are present on the substrate surface, and when such foreign matters exists on the substrate surface, in case of carrying out the crystal growth of the aluminum gallium nitride layer ($Al_xGa_{1-x}N$, $0 \leq x \leq 1$) on said substrate, due to the lattice mismatch, a crystal defect called a dislocation and a micropipe are generated, and it became apparent that a good aluminum gallium nitride layer is difficult to form. Also, such foreign matters are thought to be derived from the inorganic material such as a piece of ground substrate and abrasive used for polishing or so, and organic materials such as wax or so.

Here, the present inventors have carried out keen examination regarding the method of cleaning the substrate of after the polishing in order to remove said foreign matters. First, as the cleaning method of the semiconductor, a generally known cleaning by diluted hydrofluoric acid (DHF cleaning), and a cleaning by a mixture solution of sulfuric acid and hydrogen peroxide solution or so were examined, but the foreign matters were unable to be completely removed by such methods. Specifically, the foreign matters having certain size were removable relatively easily; however the fine foreign matters having the size of 1 µm or less were difficult to remove. The alkaline based cleaner disclosed in the patent document 2 is not designed for applying to the aluminum nitride single crystal substrate. The aluminum nitride single crystal is easily etched by alkaline; hence the alkaline cleaning may compromise the smoothness of the substrate surface. Particularly, N-polarity plane of the aluminum nitride single crystal is known to be rapidly etched by alkaline. Therefore, the alkaline cleaning of the aluminum nitride single crystal has not been considered at all.

However, the alkaline cleaning as mentioned in above is considered to be effective for removing the abrasive and organic matters or so which have remained. Thus, the cleaning of the aluminum nitride single crystal substrate surface using the alkaline based cleaning solution was examined, and it was found that as alkaline cleaning has certain degree of effect for removing fine foreign matters, however it still could not resolve the problem that the aluminum nitride single crystal face processed to have an ultraflat surface being etched by alkaline, further there were problems yet to be considered.

The present inventors have carried out further keen examination regarding the alkaline cleaning method of the aluminum nitride single crystal substrate. First, the concentration of the alkaline based cleaning solution which was effective for removing the abrasive and the organic matters was examined, then it was found that by making the concentration of the alkaline to a certain concentration or below, the etching of the aluminum nitride single crystal substrate can be suppressed. However, just by immersing the substrate into such low alkaline aqueous solution, it was difficult to sufficiently remove said fine foreign matters. Thus, the combination of the physical means and the low alkaline aqueous solution was considered. First, after immersing into the low alkaline aqueous solution, a stimulus such as ultrasonic wave was applied, but it was difficult to remove said fine foreign matters by the ultrasonic wave having the frequency of 100 kHz or less. On the other hand, the effect of removing said fine foreign matters can be expected by a mega sonic cleaning using the ultrasonic wave having the frequency of more than 100 kHz for example of 1 MHz or more, however the device performed with the ultrasonic cleaning at high frequency is complicated to handle, and also it is disadvantageous from the point of costs, thus this was difficult to use industrially. Hence, as the physical means, the scrub cleaning which scrubs the surface of the substrate by porous materials or so including the cleaning solution was considered, then a specific effect for the foreign matter removal became apparent, thereby the present invention was attained.

That is, the present invention is the cleaning method of an aluminum nitride single crystal substrate comprising, a scrub cleaning step wherein a surface of the aluminum nitride single crystal substrate is scrubbed by moving a polymer compound material in a parallel direction of the surface of said substrate while said polymer compound material contacting the surface of said substrate, and said polymer compound material has a lower hardness than the aluminum nitride single crystal and absorbed with an alkaline solution having concentration of 0.01 to 1 wt % of an alkaline which is selected from the group consisting of potassium hydroxide and sodium hydroxide.

In the present invention, during said scrub cleaning step, said alkaline aqueous solution preferably comprises citric acid and said polymer compound material comprises a melamine foam resin, a porous polyvinyl alcohol resin, a fibrous polyester resin, or a nylon resin. Further, the surface of said aluminum nitride single crystal substrate is polished by a chemical mechanical polishing method using colloidal silica, thereby significant effect can be obtained.

Also, the present invention provides the production method of the laminated body wherein an aluminum gallium nitride layer ($Al_xGa_{1-x}N$, $0 \leq x \leq 1$) having the film thickness of larger than 1 μm is placed on the aluminum nitride single crystal substrate obtained by said cleaning method.

Further, the present invention provides the aluminum nitride single crystal substrate wherein a number of foreign matters larger than 1 μm per 400 μm$^2$ of a surface of the substrate is less than 1, a number of the foreign matters of 1 μm or less is less than 1.

Effects of the Invention

According to the present invention the cleaning of the surface of the aluminum nitride single crystal substrate is carried out by scrub cleaning using the alkaline aqueous solution having concentration of 0.01 to 1 wt % of an alkaline which is selected from the group consisting of potassium hydroxide and sodium hydroxide, thereby the aluminum nitride single crystal substrate can be efficiently produced wherein the surface of the aluminum nitride single crystal substrate will not be etched, and the fine foreign matters having the size of 1 μm or less is effectively removed, and the remaining amount of the foreign matters on the substrate surface is reduced. Also, by forming the laminated body using the aluminum nitride single crystal substrate obtained by cleaning according to the present method, the crystal defect due to the lattice mismatch caused by the presence of the foreign matters on the substrate can be suppressed, thereby the laminated body with low crystal defect can be produced.

DETAILED DESCRIPTION OF THE INVENTION

The present invention relates to the cleaning method of an aluminum nitride single crystal substrate comprising, a scrub cleaning step wherein a surface of the aluminum nitride single crystal substrate is scrubbed by moving the polymer compound material in a parallel direction of the surface of said substrate while said polymer compound material contacting the surface of said substrate, and said polymer compound material has a lower hardness than the aluminum nitride single crystal and absorbed with an alkaline solution having concentration of 0.01 to 1 wt % of an alkaline which is selected from the group consisting of potassium hydroxide and sodium hydroxide. Further, the present invention relates to the production method of a laminated body wherein the aluminum gallium nitride layer ($Al_xGa_{1-x}N$, $0 \leq x \leq 1$) having the film thickness of larger than 1 μm is placed on the aluminum nitride single crystal substrate obtained by said cleaning method. Also, the present invention provides the aluminum nitride single crystal substrate wherein a number of foreign matters larger than 1 μm per 400 μm$^2$ of a surface of the substrate obtained from said cleaning step is less than 1, a number of the foreign matters of 1 μm or less is less than 1, and a root mean square roughness per 4 μm$^2$ of the surface of the substrate is 0.06 to 0.30 nm. This is obtained by carrying out the cleaning method of the present invention to the aluminum nitride single crystal substrate polished by CMP method or so, and this was not accomplished prior to the present invention. Note that, in the present invention, the foreign matters are derived from the inorganic material such as a piece of ground substrate and abrasive used for polishing or so, and organic materials such as wax or so; and the size of the foreign matters indicate the length of the maximum diameter of the foreign matter. First, the cleaning method of the substrate according to the present invention will be described in detail.

Cleaning Method

Aluminum Nitride Single Crystal Substrate

The aluminum nitride single crystal substrate used in the present invention is not particularly limited, and those produced by crystal growth methods for example of known methods such as HVPE method described in the patent document 1, and a Physical Vapor Transport method or so can be used without particular limitation. Also, in the present invention, the aluminum nitride single crystal substrate produced as such can be used to the cleaning step as it is (non-treated substrate), but the substrate surface is polished by CMP method or so using the abrasive such as colloidal silica or so, and processed to have a ultraflat surface, then it is preferably used for the cleaning step. Particularly, the aluminum nitride single crystal substrate polished by CMP method may have the remaining foreign matters derived from the abrasive or wax used for the polishing; however according to the cleaning method of the present invention, the substrate surface processed to have ultraflat surface is not etched by the cleaning solution, and the foreign matters can be effectively removed, thus the effect of the present invention can be exhibited further significantly. Further, the aluminum gallium nitride layer ($Al_xGa_{1-x}N$, $0 \leq x \leq 1$) can be deposited on the substrate which is obtained by cleaning the polished aluminum nitride single crystal substrate in accordance with the method of the present invention.

The method of polishing the untreated aluminum nitride single crystal substrate by CMP method is not particularly limited, and the known method can be employed. Specifically, the aluminum nitride single crystal substrate is rotated and applied with pressure while on the unwoven fabric or suede type pad dropped with slurry having pH of 9 to 11 which includes 20 to 45 wt % of the colloidal silica having the primary diameter of 60 to 80 nano meter; thereby the polishing is carried out.

The substrate polished as such is cleaned with flowing water, then a cleaning using diluted hydrofluoric acid (DHF cleaning) which is generally known as the cleaning method at semiconductor level, a cleaning using a mixture solution of sulfuric acid and hydrogen peroxide solution (SPM cleaning), and a cleaning using a mixture solution of hydrochloric acid (SC-2 cleaning), thereby most of the foreign matters such as abrasive of colloidal silica or so, metals and organic materials or so can be removed. However, when the visual field of 400 $\mu m^2$ (20 $\mu m \times 20$ $\mu m$) is observed by an atomic force microscope (AFM), 10 or more of fine foreign matters having the size of 1 $\mu m$ or less were remaining on the ultraflat polished surface having the root mean square roughness (RMS) of 0.1 nm or so. According to the present invention, the remaining foreign matters after the polishing and cleaning can be reduced.

Alkaline Aqueous Solution

The alkaline aqueous solution used in the present invention is the alkaline aqueous solution having the concentration of 0.01 to 1 wt % of alkaline which is selected from the group consisting of potassium hydroxide and sodium hydroxide. By using such alkaline aqueous solution, the foreign matters of the substrate surface can be effectively removed without etching the substrate surface. Also, the aluminum nitride single crystal substrate processed to have ultraflat substrate surface by CMP method or so has the ultraflat substrate surface which is not damaged by the etching, and further has high effect of removing the abrasive and organic materials present on the substrate surface after the polishing; therefore it is preferable as higher cleaning effect can be obtained. In case the concentration of the alkaline aqueous solution is higher than 1 wt %, the surface of the aluminum nitride single crystal substrate may be etched. Also, if the concentration of the alkaline aqueous solution is less than 0.01 wt %, sufficient cleaning effect cannot be obtained. Note that, the concentration of the alkaline aqueous solution is calculated based on the weight of potassium hydroxide and sodium hydroxide dissolved in the aqueous solution. In the present invention, the concentration of the alkaline aqueous solution is preferably 0.05 to 0.5 wt %, and more preferably 0.1 to 0.3 wt %.

The alkaline in the alkaline aqueous solution is selected from the group consisting of potassium hydroxide and sodium hydroxide, and it may be used alone or two of these may be used together. As the alkaline aqueous solution, reagents and industrial products prepared to have the above mentioned concentration range can be used without any particular limitation, but preferably those having the number of particles of 0.5 $\mu m$ or more being 1000 particles/ml is preferably used, and also preferably the grade for the electronic industry use is used. Also, the aqueous solution may be prepared by mixing potassium hydroxide, sodium hydroxide and water, and in such case, as potassium hydroxide and sodium hydroxide, the reagents and industrial products can be used without particular limitation, and as water, a pure water and ultrapure water having the electric resistivity of 15 MΩ·cm or more, preferably 18 MΩ·cm or more are preferably used.

Also, the alkaline aqueous solution preferably includes citric acid and/or citric acid salt (hereinafter, these may be simply referred as "citric acid") as a chelate agent. By including the citric acid, the effect of removing the abrasive and the organic materials can be enhanced, thus the substrate with even lower number of foreign matters can be obtained. Specifically, the number of the foreign matters having the size of 1 $\mu m$ or less per 400 $\mu m^2$ of the substrate surface of after being cleaned can be less than 1. As the preparation method of the alkaline aqueous solution including the citric acid, it is not particularly limited. Specifically, the method of preparing by adding the citric acid to the above mentioned alkaline aqueous solution may be mentioned; and as citric acid and/or citric acid salt for such case, citric acid or alkaline salt of citric acid can be used, and specifically citric acid, trisodium citrate and tripotassium citrate or so may be mentioned, and hydrates thereof can be also used. As these compounds, the reagents and industrial products can be used without any particular limitation. Also, the alkaline based cleaner comprising commercially available citric acid can be used; and as such alkaline based cleaner, SUNWASH MD-3041 made by Lion Specialty Chemicals Co., Ltd may be used. Also, the concentration of the citric acid in the alkaline aqueous solution is preferably 0.01 to 2 wt %, and more preferably 0.1 to 1 wt %. By setting the concentration within said range, a sufficient cleaning effect can be obtained without any chelate agent residue.

Polymer Compound Material

The polymer compound material used in the present invention has lower hardness than the aluminum nitride single crystal substrate. Here, the lower hardness than the aluminum nitride single crystal substrate means that when the aluminum nitride single crystal substrate surface is scrubbed by the polymer compound material, no scratch is formed on the substrate surface. Specifically, the material used for the scrub cleaning of the semiconductor substrate may be used, and a melamine foam resin, a porous polyvinyl alcohol resin, a fibrous polyester resin or a nylon resin are preferably used, or polyurethane and polyolefin or so can be used as well. Such material is the material which does not deteriorate by said alkaline aqueous solution, and does not damage the substrate surface and allows effectively removing the foreign matters.

Further, said polymer compound material preferably has ability to retain certain amount or more of said alkaline aqueous solution, and specifically a water retention rate (the ratio of the weight of water which can be held in said polymer compound material with respect to the dry weight of the polymer compound material) is preferably 100% or more, and more preferably 200% or more. Also, the upper limit of the water retention rate is not particularly limited. By using the polymer compound material comprising such water retention capacity, the alkaline aqueous solution can be efficiently absorbed by the polymer compound material, and the cleaning can be carried out even more effectively. As such polymer compound material having high water retention rate, for example porous material made of above mentioned resin or fibrous material (woven or unwoven fabric) may be mentioned.

Also, as the polymer compound material, the face contacting the substrate surface is preferably flat. By being flat, it can be efficiently contact with the substrate surface, and the force can be applied evenly. Further, the face of the polymer compound material contacting the substrate surface has a size preferably capable of covering entire substrate surface. By having the size capable of covering the entire substrate, a part on the substrate which is not scrubbed by the polymer compound material is reduced, thus the substrate surface can be cleaned evenly.

Method of the Scrub Cleaning Step

The scrub cleaning step is the step of scrubbing by moving said polymer compound material, which has absorbed said alkaline aqueous solution in a parallel direction of the substrate surface while contacting with the substrate surface. In regards with the scrubbing method, it is not particularly limited, and it only needs to be scrubbed in the parallel direction of the substrate surface while contacting with the substrate surface. Specifically, as the method of moving in the parallel direction of the substrate surface, the method of moving in a certain direction, the method moving by going back and forth in a certain direction, and the method of moving by rotating or so may be mentioned. However, from the point of the efficiency of the procedure, the method of moving in a certain direction, or the method of moving by going back and forth in a certain direction is preferable. Said number of the movement while contacting said polymer compound material with the substrate surface is not particularly limited, but the larger the number is, the effect of the present invention is more significant, hence it may be determined in accordance with the number of the foreign matters on the substrate. Specifically, the entire substrate surface and said polymer compound material is preferably contacted for 10 or more times, more preferably 30 times or more, and particularly 50 times or more. At this time, the alkaline aqueous solution is absorbed periodically to prevent from drying. Also, if excessive pressure is applied to the polymer compound material during the scrub cleaning step, the alkaline aqueous solution ooze out from the polymer compound material, thus the cleaning efficiency may decline. Therefore, when applying the pressure to the polymer compound material during the scrub cleaning step, the pressure which can maintain the water retention rate of 100% or more is preferable. Also, the temperature during the scrub cleaning step is not particularly limited, but it is preferably 20 to 60° C., and it may be at room temperature as well.

The substrate obtained by the scrub cleaning step is subjected to the post treatment accordingly. Specifically, the cleaning solution including the foreign matters is removed by a cleaning such as rising off with flowing water using pure water, then drying by a spin drying; thereby the aluminum nitride single crystal substrate can be obtained.

The aluminum nitride single crystal substrate obtained as such has extremely low number of the foreign matters at the substrate surface, and the foreign matters larger than 1 μm per 400 μm² of a surface of the substrate is less than 1, and the number of the foreign matters having the size of 1 μm or less can be reduced, which can be 10 or less. Further, when alkaline aqueous solution including citric acid and/or citric acid salt is used, the number of the foreign matters of 1 or less can be reduced to less than 1. Further, when using the substrate processed to have ultraflat substrate surface by CMP method or so, said surface is not etched, and the foreign matters derived from the abrasive which is used for the polishing and wax or so can be effectively removed; thus the effect of the present invention can be exhibited even more prominently. That is, in the present invention, the number of the foreign matters are reduced, and has ultraflat substrate surface which can be obtained by CMP method or so, specifically the aluminum nitride single crystal substrate wherein a root mean square roughness per 4 μm² of the substrate surface is 0.06 to 0.30 nm, furthermore 0.06 to 0.15 nm can be obtained.

The aluminum nitride single crystal substrate surface obtained by the scrub cleaning method using the above mentioned alkaline based cleaning solution and polymer compound material had the number of the foreign matters having the size of 1 μm or less per 400 μm² of the substrate surface less than 1, according to the result of analysis by AFM.

Production Method of the Laminated Body

In the present invention, the laminated body can be produced efficiently by crystal growing the aluminum gallium nitride layer ($Al_xGa_{1-x}N$, $0 \leq x \leq 1$) on the aluminum nitride single crystal substrate obtained by said cleaning method. The group III nitride semiconductor including the aluminum gallium nitride layer ($Al_xGa_{1-x}N$, $0 \leq x \leq 1$), which is obtained from the laminated body has a band structure with direct band gap at the ultra violet range corresponding to the wavelength of 200 nm to 360 nm, hence a highly efficient ultraviolet device can be produced. Also, by depositing the n-type aluminum gallium nitride layer doped with silicon (Si) even thicker, the conductivity can be enhanced; thereby highly efficient ultraviolet device can be produced. Next, the production method of the laminated body according to the present invention will be described in detail.

Oxide Film Removing Step

Immediately before MOCVD method, the aluminum nitride single crystal substrate obtained by said cleaning method is immersed for 10 minutes in the mixture solution of the phosphoric acid and sulfuric acid (phosphoric acid: sulfuric acid=1:3 (volume ratio)) which was heated to 90° C.; thereby the natural oxide film on the surface is removed. In order to prevent new foreign matters from adhering during this step, it is preferable to use Teflon (registered trademark) container which has been thoroughly cleaned by the electronic industrial reagents.

Depositing Step

The means for forming the aluminum gallium nitride layer on the aluminum nitride single crystal substrate is not particularly limited. The aluminum gallium nitride layer may be formed by MOCVD method, or it may be formed by HVPE method and MBE method or so. Hereinafter, the means of forming the n-type aluminum gallium nitride layer by MOCVD method will be described as an example, but it is not to be limited thereto.

The substrate is placed on the MOCVD reactor, and the substrate surface is subjected to a thermal cleaning, thereby the n-type aluminum gallium nitride layer ($Al_xGa_{1-x}N$, $0 \leq x \leq 1$) is deposited by MOCVD method. The thermal cleaning of the substrate surface is preferably carried out by heat treating under the mixed gas atmosphere of hydrogen gas and nitrogen gas, at the temperature range of 1000 to 1250° C. for 5 minutes or longer. The mixed gas composition may be, under standard condition, 30 to 95 vol % of hydrogen gas and 5 to 70 vol % of nitrogen gas. After the thermal cleaning, the temperature inside the reactor is set to the growing temperature of the aluminum gallium nitride layer. The growing temperature is 1050 to 1100° C., and preferably 1050 to 1090° C. or so; and by growing within this range, the aluminum gallium nitride layer having good crystallinity and smoothness can be obtained. After the reactor temperature reaches the above mentioned growing temperature, the source material gas which generates the aluminum gallium nitride is supplied in place of said mixed gas; thereby the aluminum gallium nitride layer is obtained. During the MOCVD method, the crystal growth condition such as the pressure inside the reactor, the type and flow amount of the source material gas and carrier gas or so are not particularly limited, and it may be determined accordingly depending on the mode of the reactor and the composition of the object aluminum gallium nitride layer. Although it is not to be limited in anyway, as the group III source material gas, trimethyl aluminum and trimethyl gallium or so may be used. Also, as the nitrogen source gas (a group V source material gas), ammonia may be mentioned. These source material gases may be introduced into the MOCVD reactor together with hydrogen gas and nitrogen gas which are the carrier gas. Note that, ammonia has a strong effect to etch the substrate surface, thus it is preferably introduced at the same time with the group III source material gas, or after the supply has started. The supply ratio of these source material gases (V/III ratio) may be determined accordingly depending on the composition of the aluminum gallium nitride layer of the object. In order to obtain the n-type aluminum gallium nitride layer, a dopant source material gas including Si element such as monosilane or tetraethylsilane or so may be supplied together with the group III source material gas and nitrogen source gas.

When the cleaning of the aluminum nitride single crystal substrate surface polished to have ultraflat surface by CMP or so is insufficient, the foreign matters having the size of 1 µm or less which has remained are firmly adhered to the substrate surface. Therefore, if these still remain even after the thermal cleaning, during the MOCVD step, numerous crystal defects due to the lattice mismatch will be generated while growing the aluminum gallium nitride layer, and this caused difficulty to grow good single crystal layer. By removing the foreign matters having the size of 1 µm or less from the substrate surface according to the cleaning method of the present invention, a good aluminum gallium nitride layer ($Al_xGa_{1-x}N$, $0 \leq x \leq 1$) having the film thickness exceeding 1 µm can be obtained stably.

EXAMPLE

Hereinafter, the present invention will be described based on the examples; however the present invention is not to be limited thereto. Note that, in below, % refers to wt % unless mentioned otherwise.

The polymer compound material and ultrasonic cleaning apparatus used for the below examples and comparative examples will be described.

Polymer Compound Material

Melamine foam resin: made by LEC, Inc (a porous material, the water retention rate of about 2900%)

Porous polyvinyl alcohol resin: AION Clean Room Sponge D-3 made by AION Co., Ltd. (a porous material, the water retention rate of about 650%).

Mixture of fibrous polyester resin and nylon resin: Savina MX made by KB SEIREN, LTD (a fibrous material, the water retention rate of about 200%).

Measurement of the Root Mean Square Roughness (RMS) of the Substrate Surface

The root mean square roughness was calculated by scanning 512 points×512 points of the visual field of 4 $\mu m^2$ (2 µm×2 µm) using an atomic force microscope (AFM). Note that, in the below examples and comparative examples, the measurement of the root mean square roughness (RMS) was carried out to arbitrary one range.

Measurement of the Number of the Foreign Matters on the Substrate Surface

The number of foreign matters which can be identified was measured by scanning 256 points×256 points of the visual field of 400 $\mu m^2$ (20 µm×20 µm) using an atomic force microscope (AFM). Due to the relation between the visual field and the points, the foreign matters of about 80 nm or less cannot be measured. Note that, in the below examples and comparative examples, the measurement of number of foreign matters was carried out to arbitrary one range.

Production Example 1

The substrate used in the below examples and the comparative examples was the C plane aluminum nitride single crystal substrate of which the crystal growth was carried out by HVPE method, and the Al polarity plane side was processed to have ultraflat surface by CMP method using colloidal silica abrasive (COMPOL80 made by Fujimi Incorporated). After polishing, it was rinsed off by flowing water using pure water (flow amount: 1.8 L/min) for 5 minutes, then 1% hydrofluoric acid aqueous solution was added to Teflon (registered trademark) beaker, then the substrate was placed in, and immersed for 10 minutes. The obtained substrate was rinsed off by flowing water using pure water (flow amount: 1.8 L/min) for 1 minute, then immersed in isopropanol for 1 minute, and spin dried at 6000 rpm for 30 seconds. The size of the obtained substrate had an outer diameter of 20 mm, and the thickness of 600 µm. As a result of analysis of the substrate surface by an atomic force microscope (AFM), the root mean square roughness (RMS) per visual field of 4 $\mu m^2$ was 0.15 nm or less, and the number of the foreign matters in the visual field of 400 $\mu m^2$ was 20 or more. In the below examples and comparative examples, the substrate obtained as such was used and the examination was carried out.

Example 1

The aqueous solution as the alkaline aqueous solution including 0.1% of citric acid and 0.1% of potassium hydroxide was prepared. The melamine foam resin cut into a shape of 30 mm×30 mm square was immersed in the alkaline aqueous solution to absorb, then while contacting the substrate surface it was scrubbed by moving for 60 times in a direction parallel with the substrate. Note that, per every 15 movements, the melamine foam resin was immersed in the alkaline aqueous solution for absorption. The obtained substrate was rinsed off by flowing water using pure water (ultrapure water having the electric resistivity of 18 MΩ·cm or more, same applies hereinbelow) for 1 minute, then immersed in isopropanol for 1 minute, then spin dried at 6000 rpm for 30 seconds. As a result of the analysis of the surface of the obtained substrate by an atomic force microscope (AFM), the number of the foreign matters in the visual field of 400 μm² was 0, and the root mean square roughness (RMS) per visual field of 4 μm² was 0.11 nm.

Examples 2 to 12

The procedure as same as the example 1 was carried out except for changing the alkaline aqueous solution and the polymer compound material as shown in Table 1. The result is shown in Table 1.

Example 13

The procedure as same as the example 1 was carried out except for using, as the alkaline aqueous solution, 20 fold dilution of SUNWASH MD-3041 made by Lion Specialty Chemicals Co., Ltd using pure water. The result is shown in Table 1. Note that, the stock solution of MD-3041 had the sodium hydroxide concentration of 1 to 5%, and the citric acid concentration of about 3%. Therefore, 20 fold dilution of the alkaline aqueous solution has the sodium hydroxide concentration of 0.05 to 0.25%, and the citric acid concentration of about 0.15%.

Examples 14 and 15

The procedure as same as the example 13 was carried out except for changing the polymer compound material to that shown in Table 1.

Comparative Examples 1 to 3

The procedure as same as the example 1 was carried out except for changing the alkaline aqueous solution to pure water, and changing the polymer compound material as shown in Table 1. The results are shown in Table 1.

Comparative Example 4

The cleaning solution wherein a 20 fold dilution of SUNWASH MD-3041 (made by Lion Specialty Chemicals Co., Ltd) using pure water was added to a quartz beaker then heated to 50° C., then the substrate was placed in, followed by applying an ultrasonic wave having the frequency of 100 kHz for 10 minutes. Then, the obtained substrate was rinsed off by flowing water (the flow amount: 1.8 L/min) using pure water for 1 minute, and immersed in isopropanol for 1 minute, and spin dried at 6000 rpm for 30 seconds. The result is shown in Table 1.

Comparative Example 5

The procedure as same as the comparative example 4 was carried out except for changing the frequency of the ultrasonic wave to 45 kHz. The result is shown in Table 1.

Comparative Example 6 (DHF Cleaning)

1% hydrofluoric acid aqueous solution was added to Teflon (registered trademark) beaker, then the substrate was placed in, and immersed for 10 minutes. The obtained substrate was rinsed off by flowing water (flow amount: 1.8 L/min) using pure water for 1 minute, then immersed in isopropanol for 1 minute, and spin dried at 6000 rpm for 30 seconds. The result is shown in Table 1.

Comparative Example 7 (SPM Cleaning)

1% hydrofluoric acid aqueous solution was added to Teflon (registered trademark) beaker, then the substrate was placed in, and immersed for 10 minutes. Then, the substrate was taken out, and rinsed off by flowing water using pure water (flow amount: 1.8 L/min) for 1 minute. The mixture solution of 96% sulfuric acid and hydrogen peroxide (96% sulfuric acid:hydrogen peroxide=3:1 (volume ratio)) was added to Teflon (registered trademark) beaker and heated to 120° C., then the substrate which was rinsed off by a flowing water was introduced, and immersed for 10 minutes. The obtained substrate was rinsed off by flowing water using pure water (flow amount: 1.8 L/min) for 1 minute, then immersed in isopropanol for 1 minute, and spin dried at 6000 rpm for 30 seconds. The result is shown in Table 1.

Comparative Example 8

The procedure as same as the example 1 was carried out except for changing the alkaline aqueous solution and the polymer compound material as shown in Table 1. As a result of the analysis of the surface of the obtained substrate by an atomic force microscope (AFM), the number of the foreign matters in the visual field of 400 μm² was 0, and the root mean square roughness (RMS) per visual field of 4 μm² was 0.70 nm.

TABLE 1

| | Alkaline aqueous solution | | | | Number of foreign matters *1 | |
|---|---|---|---|---|---|---|
| | Type of alkaline | Concentration of alkaine | Concentration of citric acid | Polymer compound material | larger than 1 μm | 1 μm or less |
| Example 1 | pottasium hydroxide | 0.1% | 0.1% | Melamine foam resin | 0 | 0 |
| Example 2 | pottasium hydroxide | 0.3% | 0.3% | Melamine foam resin | 0 | 0 |
| Example 3 | pottasium hydroxide | 1.0% | 1.0% | Melamine foam resin | 0 | 0 |
| Example 4 | pottasium hydroxide | 0.1% | 0.1% | Porous polyvinyl alcohol resin | 0 | 0 |
| Example 5 | pottasium hydroxide | 0.3% | 0.3% | Porous polyvinyl alcohol resin | 0 | 0 |
| Example 6 | pottasium hydroxide | 1.0% | 1.0% | Porous polyvinyl alcohol resin | 0 | 0 |
| Example 7 | pottasium hydroxide | 0.1% | 0.1% | Mixture of fibrous polyester resin and nylon resin | 0 | 0 |
| Example 8 | pottasium hydroxide | 0.3% | 0.3% | Mixture of fibrous polyester resin and nylon resin | 0 | 0 |

TABLE 1-continued

| | Alkaline aqueous solution | | | | Number of foreign matters *1 | |
|---|---|---|---|---|---|---|
| | Type of alkaline | Concentration of alkaine | Concentration of citric acid | Polymer compound material | larger than 1 μm | 1 μm or less |
| Example 9 | pottasium hydroxide | 1.0% | 1.0% | Mixture of fibrous polyester resin and nylon resin | 0 | 0 |
| Example 10 | pottasium hydroxide | 0.3% | — | Melamine foam resin | 0 | 3 |
| Example 11 | pottasium hydroxide | 0.3% | — | Porous polyvinyl alcohol resin | 0 | 8 |
| Example 12 | pottasium hydroxide | 0.3% | — | Mixture of fibrous polyester resin and nylon resin | 0 | 5 |
| Example 13 | | *2 | | Melamine foam resin | 0 | 0 |
| Example 14 | | *2 | | Porous polyvinyl alcohol resin | 0 | 0 |
| Example 15 | | *2 | | Mixture of fibrous polyester resin and nylon resin | 0 | 0 |
| Comparative example 1 | | *3 | | Melamine foam resin | 0 | 14 |
| Comparative example 2 | | *3 | | Porous polyvinyl alcohol resin | 0 | 32 |
| Comparative example 3 | | *3 | | Mixture of fibrous polyester resin and nylon resin | 0 | 20 |
| Comparative example 4 | | *2 | | *4 | 0 | 19 |
| Comparative example 5 | | *2 | | *4 | 0 | 25 |
| Comparative example 6 | | *5 | | — | 0 | 18 |
| Comparative example 7 | | *6 | | — | 0 | 21 |
| Comparative example 8 | pottasium hydroxide | 2.0% | 0.1% | Melamine foam resin | 0 | 0 |

*1 The number per visual field of 400 μm² by atomic force microscope analysis is shown
*2 20 fold dilution of SUNWASH MD-3041 using pure water was used as alkaline aqueous solution
*3 Pure water was used instead of alkaline aqueous solution
*4 Ultrasonic wave cleaning was carried out instead of scrub cleaning
*5 1% hydrofluoric acid aqueous solution was used instead of alkaline aqueous solution
*6 1% hydrofluoric acid aqueous solution and the mixture solution of 96% sulfuric acid and hydrogen peroxide was used insead of aline aqueous solution

Example 16

Oxide Film Removing Step

The mixture solution of phosphoric acid and sulfuric acid (phosphoric acid:sulfuric acid=1:3 (volume ratio)) was added to Teflon (registered trademark) beaker and heated to 90° C., then the substrate obtained in example 2 was introduced and immersed for 10 minutes. The obtained substrate was rinsed off by flowing water using pure water (flow amount: 1.8 L/min) for 1 minute, then immersed in isopropanol for 1 minute, and spin dried at 6000 rpm for 30 seconds. The result is shown in Table 1.

Depositing Step

The substrate was set on a susceptor of MOCVD reactor so that the polished face of the substrate was the outer most face, then while the mixed gas of hydrogen gas and nitrogen gas was being introduced; the pressure inside the reactor was reduced to 100 mbar in 3 minutes. The mixing ratio of the mixed gas under the standard condition was 76 vol % of hydrogen gas and 24 vol % of nitrogen gas; and the total flow amount of the mixed gas was 8.5 slm. After the pressure is reduced, the temperature inside the reactor was increased to 1210° C. in 8 minutes, and maintained at 1210° C. for 10 minutes, and then the temperature was changed to 1070° C. and the pressure to 50 mbar in 1 minute. Then, the nitrogen gas was blocked in 1 minute so that the hydrogen gas was the only gas flowing inside the reactor. Then, 80 sccm of trimethyl aluminum, 5 sccm of trimethyl gallium and 1.2 sccm of tetraethyl silane, and 1500 sccm of ammonia were introduced to the reactor, then the n-type $Al_{0.7}Ga_{0.3}N$ was grown at the pressure for 50 mbar and the reactor temperature of 1070° C. By going through the above mentioned steps, the laminated body was obtained wherein the n-type $Al_{0.7}Ga_{0.3}N$ layer (Si concentration of $1.0\times10^{19}$ $cm^{-3}$ or so) having the film thickness of 1.2 μm was provided on the aluminum nitride single crystal substrate.

Using the differential interference contrast microscope LV150 made by Nikon Corporation, from the randomly selected 5 points on the n-type $Al_{0.7}Ga_{0.3}N$ layer surface, the number of micropipes observed within the range of 640 μm×480 μm were counted, and the average value thereof was divided by the area of the observed range, and the obtained value was defined as the micropipe density. In the present step, the micropipe density of the n-type $Al_{0.7}Ga_{0.3}N$ layer of the obtained laminated body was 0 per mm².

Comparative Example 9

For the obtained substrate according to the comparative example 7, the oxide film removing step and the depositing step as same as the example 16 were carried out. In the present step, the micropipe density of the n-type $Al_{0.7}Ga_{0.3}$ layer of the obtained laminated body was 248 per mm².

The invention claimed is:

1. A cleaning method of an aluminum nitride single crystal substrate, comprising:
   a scrub cleaning step wherein a surface of the aluminum nitride single crystal substrate is scrubbed by moving a polymer compound material in a parallel direction of the surface of said substrate while said polymer compound material contacts the surface of said substrate, and
   wherein said polymer compound material has a lower hardness than the aluminum nitride single crystal and absorbed with an alkaline aqueous solution having concentration of 0.01 to 1 wt % of an alkaline which is selected from the group consisting of potassium hydroxide and sodium hydroxide.

2. The method as set forth in claim 1, wherein said alkaline aqueous solution includes citric acid in said scrub cleaning step.

3. The method as set forth in claim 1, wherein said polymer compound material in said scrub cleaning step comprises a melamine foam resin, a porous polyvinyl alcohol resin, a fibrous polyester resin, or a nylon resin.

4. The method as set forth in claim 1, wherein a surface of said aluminum nitride single crystal substrate is polished by a chemical mechanical polishing method using colloidal silica.

5. A production method of a laminated body, comprising:
scrub cleaning a surface of an aluminum nitride single crystal substrate by moving a polymer compound material in a parallel direction of the surface of said substrate while said polymer compound material contacts the surface of said substrate, wherein said polymer compound material has a lower hardness than the aluminum nitride single crystal and absorbed with an alkaline aqueous solution having a concentration of 0.05 to 0.5 wt % of an alkaline selected from the group consisting of potassium hydroxide and sodium hydroxide,
removing a natural oxide film of the surface of the substrate by immersing the aluminum nitride single crystal substrate cleaned by said scrub cleaning into a mixture solution of phosphoric acid and sulfuric acid, and
depositing an $Al_xGa_{1-x}N$ layer, $0 \le x \le 1$, by MOCVD method on the substrate obtained from said oxide film removing.

6. The production method of the laminated body as set forth in claim 5, wherein a film thickness of the $Al_xGa_{1-x}N$ layer, $0 \le x \le 1$, on the aluminum nitride single crystal substrate is thicker than 1 μm.

7. The method as set forth in claim 5, wherein said alkaline aqueous solution includes citric acid in said scrub cleaning.

8. The method as set forth in claim 5, wherein said polymer compound material comprises a melamine foam resin, a porous polyvinyl alcohol resin, a fibrous polyester resin, or a nylon resin.

9. The method as set forth in claim 5, wherein the aluminum nitride single crystal substrate obtained by said scrub cleaning has a number of foreign matters having a size of 1 μm or less per 400 μm$^2$ of a surface of the substrate surface of less than 1.

10. The method as set forth in claim 5, wherein said polymer compound material comprises a melamine foam resin, a fibrous polyester resin, or a nylon resin.

11. The method as set forth in claim 5, wherein said polymer compound material comprises a polyurethane or a polyolefin.

12. The method as set forth in claim 5, wherein a root mean square roughness per 4 pmt of the surface of the substrate obtained from said cleaning is 0.06 to 0.30 nm.

13. The method as set forth in claim 5, wherein the alkaline aqueous solution has a concentration of 0.1 to 0.3 wt % of an alkaline which is selected from the group consisting of potassium hydroxide and sodium hydroxide.

14. The method as set forth in claim 5, wherein the alkaline is potassium hydroxide.

15. The method as set forth in claim 5, wherein the alkaline is sodium hydroxide.

16. A cleaning method of an aluminum nitride single crystal substrate, comprising:
scrubbing a surface of the aluminum nitride single crystal substrate by moving a polymer compound material in a parallel direction of the surface of said substrate while said polymer compound material contacts the surface of said substrate; and
cleaning said substrate,
wherein said polymer compound material has a lower hardness than the aluminum nitride single crystal and is absorbed with an alkaline aqueous solution having concentration of 0.01 to 1 wt % of potassium hydroxide or sodium hydroxide.

* * * * *